SEMICONDUCTOR DIODE ASSEMBLY AND HOUSING THEREFOR

Filed Feb. 24, 1959

Inventors,
Calvin A. Berg
and Myron J. Johnson
By: Schneider, Dressler, Goldsmith & Clement, Attys.

United States Patent Office 3,030,558

Patented Apr. 17, 1962

3,030,558

SEMICONDUCTOR DIODE ASSEMBLY AND HOUSING THEREFOR

Calvin A. Berg, Mundelein, and Myron J. Johnson, Arlington Heights, Ill., assignors to Fansteel Metallurgical Corporation Filed Feb. 24, 1959, Ser. No. 795,170
13 Claims. (Cl. 317—234)

This invention relates to semiconductor diode assemblies, such as, for example silicon rectifier assemblies. The invention is particularly concerned with means for providing an inexpensive, compact assembly in which the semiconductor element is efficiently sealed from contaminating atmospheres and is protected against excessive mechanical pressure.

It will be understood that the present invention is applicable to semiconducting devices generally and that numerous variations and embodiments thereof within the scope of the invention may be made without departing therefrom. For convenience and for exemplification, an illustrative embodiment of the invention is described hereinbelow and shown in the accompanying drawings in conjunction with a diffused junction-type silicon rectifier element.

In silicon rectifiers, the rectifying element is a p-n junction formed within a single crystal of silicon by the controlled addition of donor or acceptor impurities by processes that are well known in the art. A silicon element of this type, however, is pressure sensitive in that its electrical characteristics vary with applied pressure. In addition it is brittle and will crack if it is subjected to excessive pressure.

Protection of the rectifying element from various atmospheric conditions is desirable because the element will combine with many contaminating substances that will affect its rectifying characteristics. Another difficulty with this type of element is that it will heat excessively when operated at high current densities. It is, therefore, necessary that the housing cool the rectifier by dissipating the heat generated by it, as by providing a heat sink or other cooling means.

It has been customary heretofore to solder a silicon rectifier element or wafer with a backing or base contact thereon, directly to a base and then solder a cat-whisker type of lead wire to the opposite face of the element. The lead wire was then drawn through a crimping tube in a "glass hat" and the glass hat was soldered to the base. Thereafter, the tube was crimped and then sealed by solder for connection to the cat whisker lead. The assembly of such devices requires considerable hand operations and is relatively expensive, not only because of the labor involved, but also because of the cost of the glass hat which utilizes a glass to metal seal.

The glass hat-type of rectifier assembly entails additional expense because the unit cannot be conveniently tested electrically until the assembly is completed. If the unit is electrically defective the entire unit must be discarded, and none of the components can be salvaged. Also, it has the additional disadvantage of necessitating a comparatively high vertical dimension. The height factor is particularly objectionable when several diodes are assembled together or "stacked."

In accordance with the present invention, the rectifying element is assembled with the upper and lower contacts as a subassembly that may be conveniently tested electrically before the assembly is encapsulated. If this subassembly is electrically defective it may be discarded and no other component of the assembly is wasted.

In the illustrative embodiment of the invention described below and shown in the drawings, the subassembly of the semiconductor element with contact parts such as plates or disks secured to the opposite faces thereof, may be assembled automatically with the other components of the housing assembly.

The mounting base or heat sink may be punch extruded from a slug of copper, aluminum or other metal which provides good thermal and electrical conductivity as well as sufficient workability to effect a tight seal when it is assembled with the other parts of the assembly. The base has an upstanding cylindrical wall and the above described subassembly fits into the space defined by the wall, with the silicon rectifying element and upper contact centrally disposed therein. An annular spacer of laminated silicone-fiberglass or other suitable insulating material is placed on the base overlying the outer edge portion of the lower contact and encircling the rectifying element and upper contact. The spacer is thermally stable and is capable of withstanding sealing and crimping forces without spalling, cracking or shattering.

A pressure contact is mounted immediately above the upper contact. The pressure contact is preferably made of copper since that is a good electrical and thermal conductor material and is also sufficiently ductile to deform under crimping pressure to prevent the application of excessive force on the silicon wafer. The pressure contact may be in the form of a comparatively short cylinder provided with an annular diaphragm.

The pressure contact is positioned with its lower face in contact with the upper contact of the rectifier subassembly with the outer edge of the diaphragm spaced above the spacer element. A resilient annular gasket, preferably of silicone rubber, is seated on the outer edge portion of the diaphragm, and the upper edge of the upstanding cylindrical wall of the base is crimped inwardly and downwardly against the gasket to complete the encapsulation of the rectifier. The crimping operation exerts pressure through the gasket against the diaphragm on the pressure contact to urge the same against the spacer element for firm assembly of the unit.

An important aspect of the present invention lies in the relationship of the dimensions of the components and parts of the housing or encapsulation assembly, and the physical characteristics thereof. When the housing is sealed by crimping the upper edge of the cylindrical wall on the base downwardly and inwardly, the crimped edge bears against the resilient annular gasket. The gasket deforms under the crimping pressure applied thereto and rests against the spacer seated on the lower contact of the rectifier subassembly.

Inasmuch as the rectifier element is brittle and pressure sensitive, the pressure applied to the diaphragm, which pressure is translated through the pressure contact and the upper contact to the wafer, must be carefully controlled. In accordance with this invention the control is effected by a controlled spacing between the upper surface of the spacer and the lower surface of the diaphragm or flange on the pressure contact. This space is selected in coordination with the factors that affect the pressure on the wafer when the assembly is crimped. These factors include the resilience or elasticity, deformability, yield point or strength, ductility, the annealing of the flange, the thickness and diameter thereof. Some pressure between the diaphragm or pressure contact and the upper contact of the rectifier subassembly is desirable to provide a good electrical connection between these two contacts. Without affecting the other features of the invention, electrical contact between the pressure contact and the upper member of the subassembly may be enhanced by soldering or otherwise mechanically joining the members. If the pressure is too great the silicon wafer will be cracked. In accordance with this invention the pressure on the wafer is controlled by controlling the axial dimension of the spacing in accordance with the factors mentioned above, and thereby controlling the magnitude of the deformation of the flange or diaphragm when the crimping operation is effected.

The crimping of the upper edge of the cylindrical wall of the base to seal the rectifying element in the complete assembly eliminates the necessity of providing an insulating glass to metal seal, which is relatively expensive. Assembly and sealing in accordance with this invention also permit considerable reduction in the overall vertical dimension when compared to the usual glass hat-type of sealed assembly.

The structure by means of which the above-mentioned and other advantages of the invention are attained will be described in the following specification, taken in conjunction with the accompanying drawings showing two illustrative embodiments of the invention and forming a part of this specification, in which like reference numerals refer to like parts and in which.

Figure 1:
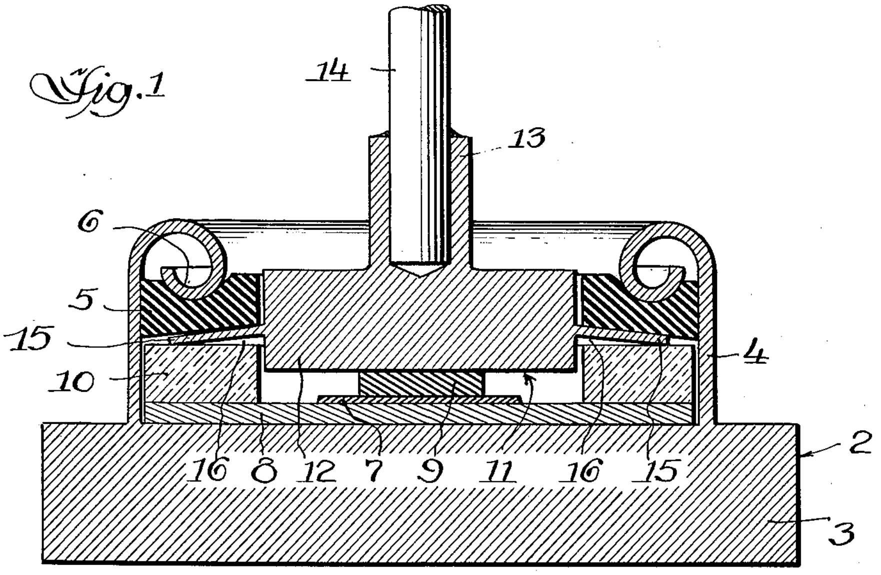
FIGURE 1 is a vertical sectional view of an embodiment of the invention.
Figure 2:
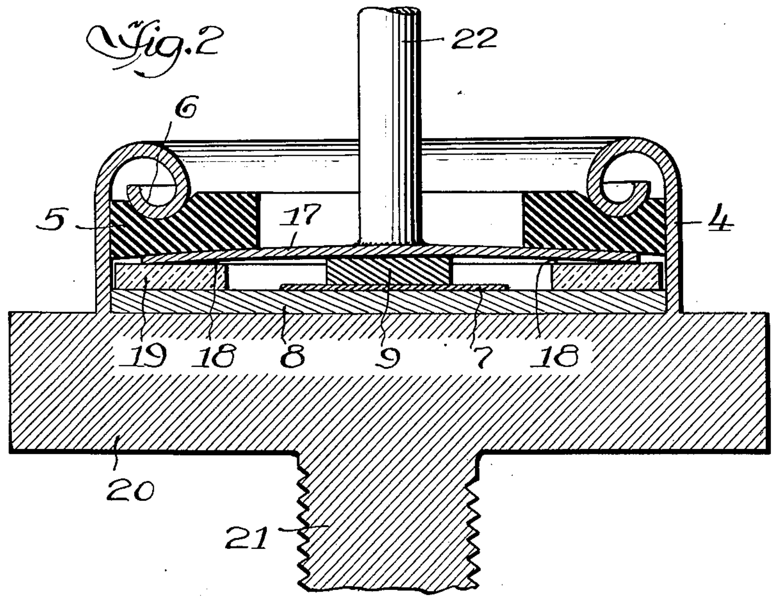
FIGURE 2 is a vertical sectional view of another embodiment of the invention.

The embodiment of the invention shown in FIGURE 1 of the drawings has a base 2 comprising a flat cylindrical member 3 having an integral wall 4 extending upwardly in the form of a tubular cylinder. The underside of base 2 is shown as being flat so that the rectifier can be soldered or welded in place, but it is obvious that it can be provided with a depending threaded stud, as shown in FIGURE 2, to permit to be threaded into a socket, or by means of which a cooling fin may be attached, if desired.

The base 2 with the side wall 4 thereof may be formed in any suitable manner. One method is to extrude the wall from the base by impact on a slug of metal of appropriate size and characteristics. It is preferred to make the base of electrolytic tough pitch copper or other material which will provide good thermal and electrical conductivity. The material is sufficiently workable to permit crimping to effect a tight seal between the upper edge portion of the wall 4 and a resilient annular gasket 5 against which it is crimped, as indicated at 6 as hereinafter described.

A subassembly, comprising a silicon wafer 7 soldered to a lower contact 8 and an upper contact 9, is positioned on the flat upper surface of base 2 within the confines of upstanding wall 4. The lower contact has a diameter which is slightly less than the inside diameter of wall 4 to provide convenient automatic positioning and assembly with the wall 4. Also, it provides a backing for the silicon wafer and facilitates positioning the subassembly relative to the base. The silicon wafer rectifier is preferably of the diffused junction type and is centrally disposed on the lower contact 8. The upper contact 9 has a smaller diameter than wafer 7 to provide for convenient assembly without creating short circuits during soldering of the upper and lower contacts to the wafer, and is centrally disposed on the wafer. The upper and lower contacts are made of materials having good electrical and thermal conductivity such as oxygen-free hard copper or brass, and are silver or gold plated to protect them against corrosion and to provide a readily solderable surface.

An annular spacer 10 is positioned on the upper surface of lower contact 8. The spacer has an outer diameter approximately equal to the diameter of lower contact 8, and an inner diameter larger than the diameter of silicon wafer 7. It is preferred to make spacer 10 of laminated silicone-fiberglass or entirely of glass, but any suitable, hard, thermally stable, electrical insulating material that will not be deformed by crimping pressure and is capable of withstanding the force applied during crimping without spalling, cracking or shattering, may be used.

A pressure contact 11, which may be made of copper, positioned against the upper face of the upper contact 9, in this embodiment of the invention comprises a cylindrical body portion 12 having a diameter slightly smaller than the inner diameter of spacer 10. The lower portion of contact 11 depends into the opening in spacer 10 to engage the upper surface of the contact 9, which surface lies in a plane below the top surface of spacer 10. A tubular socket 13 preferably extends upwardly from the top surface of contact 11 to receive a lead wire 14 which is soldered to hold it firmly in place. If desired, the socket 13 may be omitted, and the lead wire may be soldered directly to the top surface of the pressure contact 11.

A radial, annular diaphragm or flange 15 extends outwardly from the cylindrical body portion 12 of the pressure contact 11, in a plane spaced above the top of the spacer 10. The underside of the diaphragm is spaced, as at 16, from the top surface of spacer 10 adjacent the inner edge of the spacer.

The space 16 results from the fact that the total height of the wafer, the upper contact soldered to the wafer, and the lower cylindrical portion of the pressure contact which is below the lower face of the flange at the line of juncture between the flange and the pressure contact, is greater than the height of the spacer 10. Stated another way, the total height of the wafer and contacts therefor disposed above the wafer and below the diaphragm or flange is greater than the axial dimension or height of the spacer.

The importance of space 16 is discussed below in conjunction with a discussion of the assembly on the significant features thereof. Also, some of the important aspects of the space 16 are discussed above in the short description of the invention preceding the identification of the drawings.

Returning now to the structure of the illustrative embodiment of the invention shown in FIGURE 1, gasket 5, which is seated on the top of diaphragm 15, has an outer diameter substantially equal to or slightly less than the inner diameter of the cylindrical wall 4; and it has an inner diameter slightly larger than the diameter of cylindrical body portion 12 of the pressure contact 11. The gasket, which is an electrical insulator, is preferably formed of silicone rubber. It has sufficient resilience to deform under the assembly crimping pressure and is able to withstand temperature variations of from about −50° C. to about 175° C. without significant loss of its elastic and insulating qualities. The gasket is also impervious to airborne corrosive agents and is inert to various oils, greases and solvents. The gasket 5 provides an efficient protective seal for the rectifier under substantially all conditions of shock and stress.

When the components of the unit including the base, the subassembly of the lower contact, the silicon wafer and the upper contact, the spacer, the pressure contact and the gasket are assembled in the described manner, either manually or automatically, the upper edge 6 of the cylindrical wall 4 on the base 2 is crimped or rolled inwardly in one or two stages of automatic or semiautomatic operation to crimp the edge portion 6 against the upper surface of the gasket 5. This operation accomplishes several objectives: it firmly and effectively secures the components together; it presses the pressure contact into good electrical contact with the upper contact of the subassembly; and it spreads the gasket to provide an effective atmospheric seal for the diffused junction silicon wafer.

The silicon wafer, however, is pressure sensitive and its electrical characteristics vary with the pressure applied against it. In addition, the silicon wafer is brittle and will crack when subjected to excessive pressure. It is important, therefore, that the pressure applied to the silicon wafer during the crimping operation be carefully controlled. Space 16 provides the safety feature that limits the pressure to which the silicon wafer is subjected during the sealing of the rectifier assembly.

When the upper edge portion of cylindrical wall 4 is crimped against gasket 5 to seal the rectifier assembly crimping pressure is applied by said upper edge portion against the top of the gasket. Since the gasket is resilient, some of the pressure will be absorbed in compressing the gasket, but most of it will be transmitted to the diaphragm 15 to spacer 10 and to the upper contact 9 of the subassembly. This pressure will deform the diaphragm so that its outer edge portion will engage the upper surface of the spacer 10. Some of the crimping pressure will be transmitted to the portion of diaphragm 15 which is spaced from the top surface of spacer 10. A small portion of this pressure will be transmitted by diaphragm 15 to contacts 9 and 11, but most of it will be dissipated in deforming the diaphragm.

Space 16 permits deformation of diaphragm 15, and thereby limits the transmission of crimping pressure to the silicon wafer. The pressure transmitted to contact member 11 by diaphragm 15 is dependent upon many factors such as the resilience and the ductility of the metal of the diaphragm, and upon the thickness and the diameter of the diaphragm.

The pressure applied to deform the diaphragm should not exceed the yield point of the metal so that the contact 11 will always be in resilient engagement with the upper contact of the subassembly thereby making good electrical engagement with it.

The pressure applied to contact 11 by the crimping operation is sufficient to afford a firm contact between its lower surface and the top surface of upper contact 9, but is not enough to crack the silicon wafer or to deleteriously affect its electrical characteristics. When the wall 4 is crimped against gasket 5 the rectifying element 7 is completely sealed from the atmosphere, and is therefore protected against any contaminating substances that might affect its rectifying characteristics. The rectifying element is also protected from the effects of the heat generated by its operation at high current densities by the metal on both sides of it. The metal contacts dissipate the heat by conduction.

The upper and lower contacts may be assembled with and soldered to the rectifying element by manual, semi-automatic or automatic operations. When the subassembly is completed, the rest of the assembly operations also may be done automatically. The elimination of most of the hand operations required in the assembly of rectifiers previously used, reduces the cost of the rectifier to a substantial extent.

The embodiment shown in FIGURE 2 is very similar to that of FIGURE 1 and the description of identical parts, referred to by the same reference characters, will not be repeated. The principal difference between the two embodiments is that the pressure contact 17 is in the form of a diaphragm having a substantially uniform thickness. A space 18 coordinated with the characteristics and dimensions of the diaphragm is provided between its lower surface and the surface of an annular spacer 19.

The spacer 19 is similar to the spacer 10, except that its height is less than the height of the spacer 10. In this embodiment of the invention, the spacer 19 is proportioned to have a height less than the combined height of only silicon wafer 7 and upper contact 9. The shape of the pressure contact is responsible for the difference in height between the spacers 10 and 19 of the two embodiments, respectively. In both embodiments of the invention, however, the total height of the wafer and the contacts therefor disposed above the wafer and below the diaphragm is greater than the axial dimension or height of the spacer so as to provide for resilient, limited deformation of the diaphragm.

The base 20 of the assembly of FIGURE 2 is provided on its underside with a depending stud 21 threaded to fit in a socket, but it will be understood that the underside of the boss may be flat, if desired. FIGURE 2 also shows a lead wire 22 soldered directly to the top surface of pressure contact 17, but a tubular socket, such as the socket 13 in FIGURE 1, may be provided.

Although we have described two embodiments of the invention in considerable detail it will be understood that the description is intended to be illustrative, rather than restrictive, as many details may be modified or changed without departing from the spirit or scope of the invention.

We claim:

1. In a semiconductor diode assembly, a base, a semiconductor wafer positioned on said base, a spacer encircling said wafer, a contact electrically coupled to said wafer and comprising a deformable diaphragm having its outer edge overlying said spacer, an annular resilient gasket seated on the outer edge portion of said diaphragm, and means exerting pressure against said gasket to seal said assembly and urging the edge of said diaphragm against said spacer, said diaphragm limiting the transmission of pressure from said means to said semiconductor wafer.

2. In a semiconductor diode assembly, a base, a semiconductor wafer positioned on said base, a spacer encircling said wafer, a contact member engaging the upper surface of said wafer, a deformable diaphragm contacting said contact member and having its outer edge overlying said spacer, an annular resilient gasket seated on the outer edge portion of said diaphragm, and means exerting pressure against said gasket to seal said assembly and urging the edge of said diaphragm against said spacer, said diaphragm limiting the transmission of pressure from said means to said semiconductor wafer.

3. In a semiconductor diode assembly, a base, a semiconductor wafer positioned on said base, a spacer encircling said wafer, a contact member engaging the upper surface of said wafer, a deformable diaphragm contacting said contact member and having its outer edge overlying said spacer, the upper surface of said spacer being disposed below the upper surface of said contact member, an annular resilient gasket seated on the outer edge portion of said diaphragm, and means exerting pressure against said gasket to seal said assembly and urging the edge of said diaphragm against said spacer, said diaphragm limiting the transmission of pressure from said means to said semiconductor wafer.

4. In a semiconductor rectifier assembly, a base having an upstanding wall, a subassembly positioned on said base within the confines of said upstanding wall, said subassembly comprising a semiconductor wafer and a contact secured to each face of said wafer, a third contact superimposed on said subassembly, and a gasket superimposed on the outer edge portion of said third contact, the upper edge portion of said upstanding wall being crimped against said gasket to seal said assembly and thereby protect said semiconductor wafer from the atmosphere.

5. In a semiconductor diode assembly, a base having an upstanding cylindrical wall, a subassembly positioned on said base within the confines of said upstanding wall, said subassembly comprising a semiconductor wafer and a contact secured to each face of said wafer, an annular spacer superimposed on the outer edge portion of said subassembly, a third contact engaging the upper surface of the upper of the first mentioned contacts and comprising a diaphragm having an outer edge portion overlying said spacer, and a gasket superimposed on at least the outer edge portion of said diaphragm, the upper edge portion of said upstanding wall being crimped against said gasket to seal said assembly and urging at least the outer edge portion of said diaphragm against said spacer.

6. In a semiconductor diode assembly, a base having an upstanding cylindrical wall, a subassembly positioned on said base within the confines of said upstanding wall, said subassembly comprising a semiconductor wafer and a contact secured to opposed faces of said wafer, an annular spacer superimposed on the outer edge portion of said subassembly, a third contact engaging the upper surface of the upper of the first mentioned contacts and comprising a diaphragm having an outer edge portion overlying said spacer, the total height of said wafer contacts therefor disposed above the wafer and below said diaphragm being greater than the height of said spacer, and a gasket superimposed on at least the outer edge portion of said diaphragm, the upper edge portion of said upstanding wall being crimped against said gasket to seal said assembly and urging at least the outer edge portion of said diaphragm resiliently against said spacer.

7. In a semiconductor diode assembly, a base having an upstanding cylindrical wall, a semiconductor wafer positioned within the confines of said upstanding wall, an annular spacer encircling said wafer, a contact secured to the top surface of said wafer, a pressure contact superimposed on said first mentioned contact, said pressure contact having a deformable outer edge portion overlying said spacer and a resilient gasket seated on said outer edge portion of said pressure contact, the upper edge portion of said upstanding wall being crimped against said gasket to seal said assembly and to urge said outer edge portion of said pressure contact against said spacer, the total height of said wafer contacts therefor disposed above the wafer and below said diaphragm being greater than the height of said spacer whereby a limited space is provided to limit the transmission of the crimping pressure to said semiconductor wafer.

8. In a semiconductor diode assembly, a base having an upstanding cylindrical wall, a semiconductor wafer positioned within the confines of said wall, a contact secured to the top surface of said wafer, an annular spacer positioned within the confines of said wall and encircling said wafer, a second contact superimposed on said first mentioned contact, a deformable annular diaphragm extending outwardly from the outer edge of said second contact, said diaphragm having its outer edge overlying said spacer and its inner portion spaced thereabove to permit limited deformation of said diaphragm by pressure applied thereto, a resilient gasket seated on said diaphragm, and means exerting pressure against the top of said gasket to seal said assembly, the transmission of pressure from said means through said contacts to said wafer being limited by the deformation of said diaphragm.

9. In a semiconductor diode assembly, a base having an upstanding cylindrical wall, a semiconductor wafer positioned within the confines of said wall, a contact secured to the top surface of said wafer, an annular spacer positioned within the confines of said wall and encircling said wafer, a second contact superimposed on said first mentioned contact, a deformable annular diaphragm extending outwardly from the outer edge of said second contact, said diaphragm having its outer edge overlying said spacer and its inner portion spaced thereabove to permit limited deformation of said diaphragm by pressure applied thereto, the total height of said wafer contacts therefor disposed above the wafer and below said diaphragm being greater than the height of said spacer, a resilient gasket seated on said diaphragm, and means exerting pressure against the top of said gasket to seal said assembly, the transmission of pressure from said means through said contacts to said wafer being limited by the deformation of said diaphragm.

10. In a rectifier assembly, a pressure sensitive rectifying element comprising a thin wafer, a base for holding said wafer, an annular spacer encircling said wafer, a contact adapted to hold said wafer against one surface of said base, said contact comprising a diaphragm overlying the top surface of said spacer and having its outer edge resiliently seated on said spacer, a resilient gasket seated on the outer edge portion of said contact, and pressure means in engagement with said gasket to seal said wafer from the atmosphere, said diaphragm and spacer cooperating to prevent transmission of excessive pressure from said pressure means to said wafer.

11. A diode assembly comprising a base having an upstanding cylindrical wall, an annular spacer seated on said base within the confines of said upstanding wall, a pressure-sensitive semiconductor diode positioned on said base within the confines of said spacer, a pressure contact having a cylindrical body portion extending into the space within said spacer above said diode, an annular deformable diaphragm projecting outwardly from said cylindrical body portion in a plane spaced above said spacer, and a resilient gasket seated on said diaphragm, the upper edge portion of said upstanding wall being crimped into engagement with said gasket to seal said assembly, said deformable diaphragm cooperating with said spacer to prevent transmission of excessive pressure from said gasket to said diode.

12. A diode assembly comprising a base having an upstanding cylindrical wall, an annular spacer seated on said base within the confines of said upstanding wall, a pressure-sensitive semiconductor diode positioned on said base within the confines of said spacer, a contact member overlying said pressure-sensitive semiconductor diode and within the confines of said spacer, a pressure contact comprising an annular deformable diaphragm of substantially uniform thickness engaging said contact member and overlying said spacer in a plane spaced above said spacer, and a resilient gasket seated on said diaphragm, the upper edge portion of said upstanding wall being crimped into engagement with said gasket to seal said assembly, said deformable diaphragm cooperating with said spacer to prevent transmission of excessive pressure from said gasket to said diode.

13. A protective housing for a pressure-sensitive semiconductor wafer comprising a base having an upstanding cylindrical wall, a semiconductor wafer on said base, an annular spacer mounted on said base within the confines of said upstanding wall, a contact comprising a diaphragm extending over the top surface of said spacer and over said wafer and having its outer edge urged against said spacer, and an annular gasket seated on the outer edge portion of said diaphragm, the upper edge of said upstanding wall being crimped into engagement with said gasket to seal said housing.

References Cited in the file of this patent

UNITED STATES PATENTS

| | | |
|---|---|---|
| 2,751,528 | Burton | June 19, 1956 |
| 2,756,374 | Colleran et al. | July 24, 1956 |
| 2,861,226 | Lootens | Nov. 18, 1958 |
| 2,897,419 | Howland et al. | July 28, 1959 |
| 2,921,245 | Wallace et al. | Jan. 12, 1960 |